United States Patent [19]

Brust

[11] Patent Number: 4,752,686
[45] Date of Patent: Jun. 21, 1988

[54] METHOD AND APPARATUS FOR EMPHASIZING A SPECIMEN SURFACE REGION SCANNED BY A SCANNING MICROSCOPE PRIMARY BEAM

[75] Inventor: Hans D. Brust, Dudweiler, Fed. Rep. of Germany

[73] Assignee: Siemens Aktiengesellschaft, Berlin & Munich, Fed. Rep. of Germany

[21] Appl. No.: 842,181

[22] Filed: Mar. 21, 1986

[30] Foreign Application Priority Data

Mar. 22, 1985 [DE] Fed. Rep. of Germany ....... 3510484

[51] Int. Cl.$^4$ .............................................. H01J 37/26
[52] U.S. Cl. ..................................... 250/310; 250/307
[58] Field of Search ........... 250/492.2, 492.22, 396 R, 250/398, 306, 307, 310, 311

[56] References Cited

U.S. PATENT DOCUMENTS

| | | | |
|---|---|---|---|
| 3,614,311 | 10/1971 | Fujiyasu et al. | 250/310 |
| 3,711,711 | 1/1973 | Dao et al. | 250/310 |
| 3,944,829 | 3/1976 | Sato | 250/310 |
| 4,006,357 | 2/1977 | Kanda et al. | 250/310 |
| 4,071,759 | 1/1978 | Namae | 250/310 |
| 4,199,681 | 4/1980 | Namae | 250/311 |
| 4,392,054 | 7/1984 | Sato et al. | 250/307 |

OTHER PUBLICATIONS

J. J. DeStafeno et al., "Scanning Electron Microscope System for Testing Circuit Devices", 19(3), IBM Technical Disclosure Bulletin, 1007–1008, (Aug. 1976).
L. Reimer and G. Pfefferkorn, Raster-Elektronenmikroskopes, Springer-Verlag, Berlin, 1977, pp. 1–3 and 109–130.

Primary Examiner—Bruce C. Anderson
Assistant Examiner—Paul A. Guss
Attorney, Agent, or Firm—Hill, Van Santen, Steadman & Simpson

[57] ABSTRACT

During line-by-line scanning of a specimen surface by a primary beam of a scanning microscope, a predetermined specimen region is emphasized by comparing deflection voltages of a deflection means of the primary beam to variable comparison voltages and thereby generating a control signal which indicates whether a scanned point on the specimen surface lies within a predetermined region. The control signal is used to vary one or more scan parameters, such as the scan rate, the bandwidth of an evaluation circuit, or the intensity of the primary scan beam. An alternate embodiment includes an analog function network to generate the control signal.

32 Claims, 2 Drawing Sheets

METHOD AND APPARATUS FOR EMPHASIZING A SPECIMEN SURFACE REGION SCANNED BY A SCANNING MICROSCOPE PRIMARY BEAM

BACKGROUND OF THE INVENTION

1. Field of the Invention

The present invention relates to a method and device for variably scanning a specimen with a scanning microscope to emphasize a region on a specimen surface.

2. Description of the Prior Art

In line-by-line scanning of a specimen surface by a scanning microscope, the maximum allowable scan rate for an interesting region of the specimen has determined the scan rate for the entire scan operation, even if such scan rate results in relatively long imaging times. A loss in resolution of the region of interest results if the scan rate is increased above such maximum rate, even if a higher rate could have been utilized outside the region of interest.

It is known in the art to generate a topographic signal of a specimen surface from an electrical scan signal derived from secondary electrons generated during a scan operation, as shown in L. Reimer and G. Pfefferkorn "Raster-Elektronenmikroskopie", Springer-Verlag, Berlin, 1977, cf. pp. 103 and 109–130.

SUMMARY OF THE INVENTION

It is an object of the present invention to reduce specimen imaging times while retaining precise representations of interesting specimen surface regions. The present invention is embodied in a method and apparatus for comparing deflection signals for a primary scanning beam to signals defining known regions of interest on a specimen. In a scanning microscope, deflection of the primary beam during scanning is controlled by deflection voltages. The deflection voltages are compared by discriminator units to predetermined comparison signals to indicate whether a point being scanned lies within a region of interest, such as a region of high density on an integrated circuit. A control signal is generated by the discriminator units which controls variations in one or more scan parameters, depending upon the location of the scan point. For instance, the control signal may vary either the scan rate or the bandwidth of an image evaluation circuit or may vary the intensity of the primary scanning beam. The present method and device, thus, provides high spatial resolution and imaging sensitivity for selected specimen regions while simultaneously reducing image recording times for the overall specimen surface.

DESCRIPTION OF THE PREFERRED EMBODIMENTS

Figure 1:
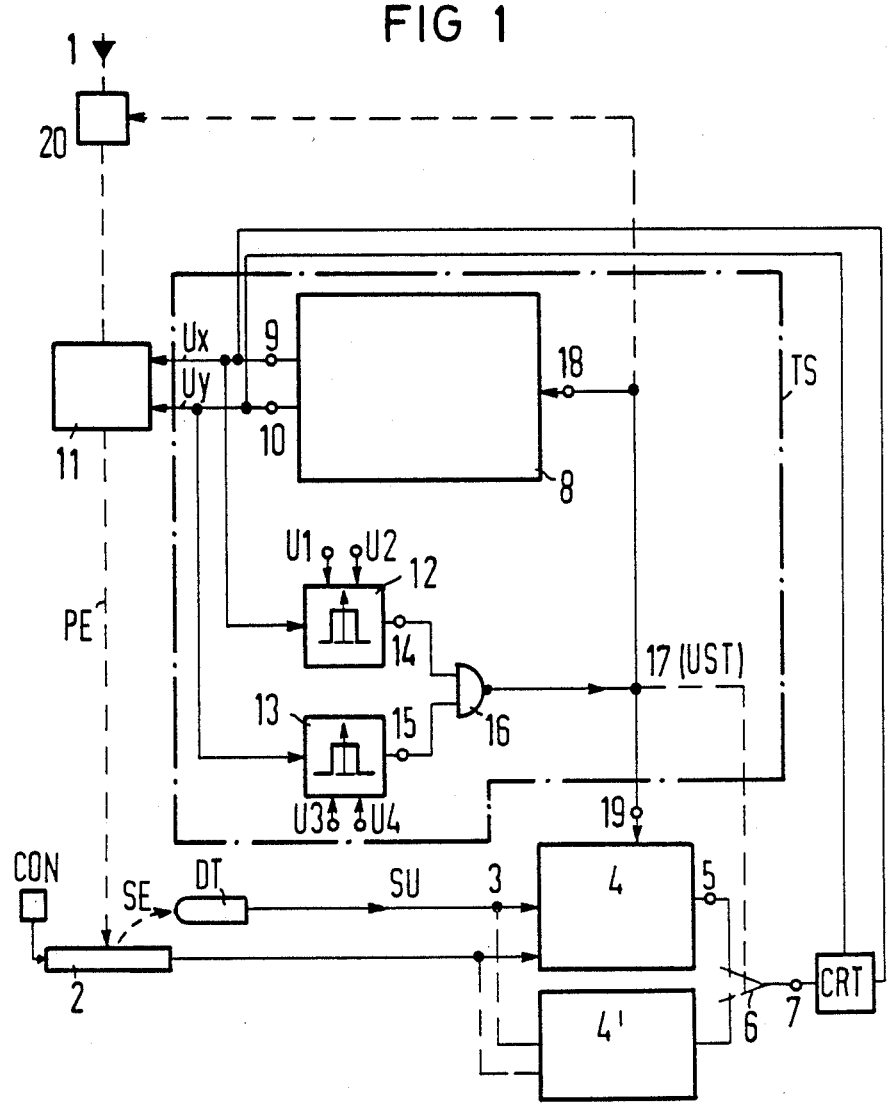
FIG. 1 is a block diagram of a scanning microscope apparatus for implementing a method according to the principles of the present invention.

A specimen scanning apparatus is shown in FIG. 1, including an electron source 1 of a scanning electron microscope which generates a primary electron beam PE. The primary seam PE is directed toward a specimen 2, which may be an integrated circuit having one or more portions on a surface thereof of particular interest. Upon impinging the specimen, the primary beam PE triggers the generation of secondary electrons SE which are picked up by a detector DT, that may include a photomultiplier (not shown), to generate a secondary electrical signal SU corresponding to the secondary electrons SE. The secondary electrical signal SU is transmitted to an input 3 of an evaluation circuit 4, generally of limited bandwidth, which selects and demodulates or, alternately, rectifies signal components of the electrical signal SU to generate an output signal at an output 5. The evaluation circuit output signal is supplied to an intensity control input 7 of a display picture tube CRT.

A scan generator 8, by way of its outputs 9 and 10, drives the horizontal and vertical deflections, respectively, of the display CRT. Other recording and display devices can be used in place of the picture tube CRT, such as for example, a plasma display screen or an LCD display.

The primary electron beam PE is likewise deflected, preferably in a line-by-line scan, or grid shaped scan, by signals at the outputs 9 and 10 of the scan generator 8. The scan generator output 9 supplies a horizontal deflection voltage Ux to a corresponding horizontal signal input of a beam deflection unit 11 and the output 10 of the scan generator 8 supplies a vertical deflection voltage Uy to a vertical signal input of the beam deflection unit 11. The deflection unit 11 is mounted to deflect the primary beam PE across the surface of the specimen 2. There is, thus, synchronous deflection of the primary beam PE over the surface of the specimen 2 and of the electron beam over the screen of the display picture tube CRT.

A controller CON is connected to the specimen 2 to supply an input signal of frequency fs thereto, or alternately to operate the specimen 2 so that a signal having a specific signal frequency fs is generated at scan points on the specimen. When scanned by the primary beam PE, the signal fs influences the quantity of emerging secondary electrons SE so that the secondary electrical signal SU includes a signal component having the frequency fs. By tuning the evaluation circuit 4 to the signal frequency fs, the signal component is selected and demodulated so that the output signal at the output 5 indicates the presence or absence of a signal having a frequency fs at the scan point on the specimen 2. Line-by-line scanning of the specimen surface results in those portions of the specimen 2 having the signal frequency fs being displayed on the picture tube CRT by trace unblanking of the electron beam.

The deflection voltage Ux is supplied to a first discriminator unit formed of a comparator 12 which is connected to first and second horizontal comparison voltages U1 and U2. The comparator 12 generates a region indicating output signal at an output 14 when the horizontal deflection voltage Ux lies within a range between the two comparison voltages U1 and U2. A second discriminator unit is connected to receive the vertical deflection voltage Uy and is formed of a comparator 13 connected to first and second vertical comparison voltages U3 and U4. Likewise, an output 15 of the comparator 13 emits a region indicating output signal when the vertical deflection voltage Uy is between the comparison voltages U3 and U4. The signals from the outputs 14 and 15 are fed to inputs of a NAND gate 16 to produce a control signal UST at circuit node 17. The control signal UST changes depending on whether the horizontal and vertical deflection voltages Ux and Uy lie within the voltage ranges defined by the respective comparison voltages U1, U2, U3 and U4. When the horizontal comparison voltages U1 and U2, and the vertical comparison voltages U3 and U4 are set to correspond to limits of a region of interest on the specimen surface 2, then the control signal UST indicates whether a point being scanned lies within this region.

The control signal UST is supplied to a control input 18 of the scan generator 8 so that changes in the control signal cause the generator 8 to change scan speeds. The scan speed changes are such that portions of the specimen 2 outside the region of interest are scanned at a significantly higher scan rate than the portion within the region of interest. Thus, the imaging time for a specimen is substantially reduced without exceeding a maximum scan rate required for precise evaluation of a particular specimen region of interest.

To further emphasize the region of interest and enable precise evaluation of the secondary signals SU generated within the interesting specimen region, the control signal UST is supplied to a control input 19 of the evaluation circuit 4. The control signal UST causes a switch-over from a broad-band operating mode of the evaluation circuit 4, as is used in analyzing the signal SU outside the region of interest, to a narrow band operating mode for more critical analysis of the signal SU from the region of interest.

Alternately, a second evaluation circuit 4' is included having a more narrow band than the evaluation circuit 4 which is connected parallel to the circuit 4. A switch-over means 6, which is controlled by the control signal UST, is connected at the intensity control input 7 of the display CRT to switch between the evaluation circuit 4 and the evaluation circuit 4'. The display CRT, thus, receives the signal of the narrow band evaluation circuit 4' during scanning of the region of interest. The changes in the evaluation circuit bandwidth, or alternately switching between broad-band evaluation circuit 4 and the narrow-band evaluation circuit 4', can be used either with or without corresponding changes in the scan generator 8 scan speed.

A particular advantage of the present invention is realized by using the control signal UST to control the intensity of the primary electron beam PE. This is particularly recommended for imaging sub-regions of a specimen 2 which are sensitive, or react adversely, to electron radiation. For example, regions of a specimen surface may be particularly susceptible to undesired electrical charging. An intensity modulator 20 is controlled by the control signal UST to diminish the intensity of, or entirely blank, the primary beam PE as predetermined specimen regions are scanned. The intensity modulator 20 may be, for example, a beam blanking system or Wehnelt cylinder provided adjacent the electron source 1 of the scanning electron microscope. The intensity modulator 20 may also be used with a variable scan generator 8 to change beam intensity as the scan rate is changed. It is, thus, possible that when the specimen is scanned with a variable intensity beam at a variable scan rate, that an approximately constant energy level is received at the specimen surface.

It is also foreseen to generate a topographic, or an overview, signal from the secondary electrical signals and use the control signal UST to control a switch between the topographic signal and the evaluation circuit output signal at the input of the display tube CRT. The topographic signal is, generally, acquired at higher scan rates than the evaluation circuit signal.

Figure 2:
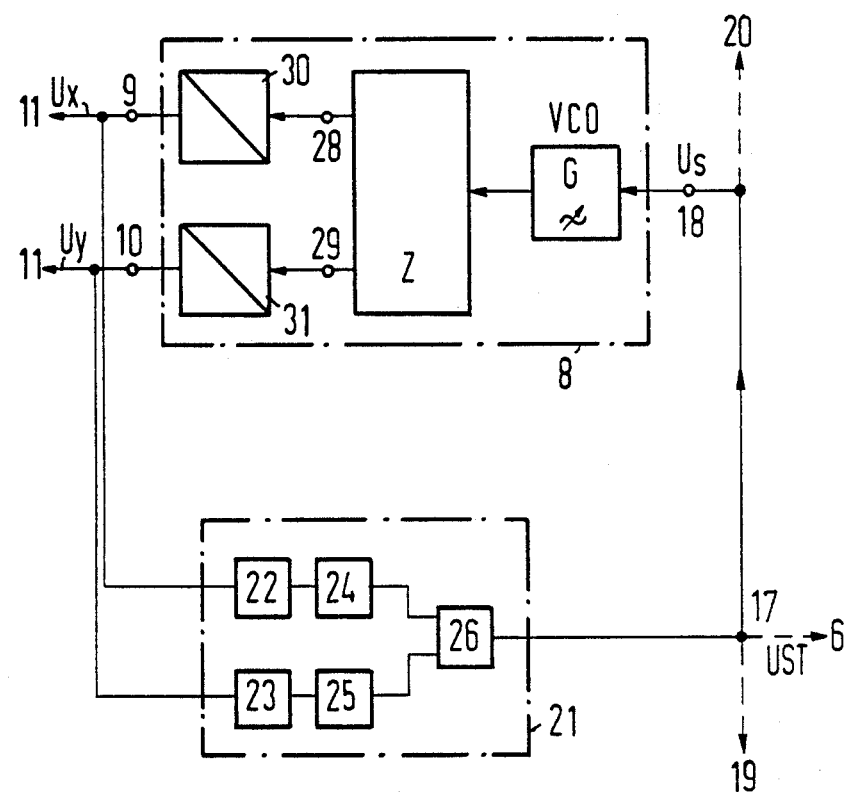
FIG. 2 is an alternate embodiment of a portion of the device shown in FIG. 1.

The scan generator 8, discriminator circuits 12 and 13, and NAND gate 16 form a sub-circuit TS in the embodiment of FIG. 1. In FIG. 2 is shown a second embodiment of the sub-circuit TS, including an analog function network 21 which generates the control signal UST from the horizontal and vertical deflection voltages Ux and Uy. In a preferred embodiment, the function network 21 includes first and second signal squaring units 22 and 23 and first and second amplifier stages 24 and 25, which are preferably variable gain amplifiers, connected to the respective outputs of the squaring units 22 and 23. An adding unit 26 is connected to add the outputs of the amplifier stages 24 and 25 and generate the control signal UST as an output at circuit node 17. The function network 21, as shown, thus embodies a function $$UST = A \times Ux^2 + B \times Uy^2,$$

wherein A is the gain of the amplifier stage 24 and B is the gain of the amplifier stage 25.

If assuming the neutral, or zero, voltage points for the horizontal and vertical deflection voltages Ux and Uy, respectively, correspond to a point lying on a central region of the specimen surface, then the control signal UST is relatively small for the central region of the specimen surface and relatively larger for edge regions thereof. The dimensions of the central region can be modified in a horizotnal deflection direction or, respectively, a vertical deflection direction by adjusting the gains of the respective amplifier stages 24 or 25.

A similar effect is achieved when the function network 21 is constructed to embody the formula $$UST = (A \times Ux + B \times Uy)^2.$$

In such function network 21, the two deflection voltages Ux and Uy are supplied through variable gain amplifiers having respective gains A and B to an adder unit and the output signal of the adder is fed to a squaring circuit. The output of the squaring circuit is the control signal UST.

In addition to the above functions, the control signal UST can be generated in other forms, such as for example, a curve having continuous amplitude sections.

The control signal UST generated in the circuit of FIG. 2 is used to vary the scan rate and/or vary the bandwidth of the evaluation circuit and/or vary the intensity control of the primary electron beam PE. In one embodiment, a scan generator 8 is shown in FIG. 2 having a clock oscillator G, the frequency of which is controlled by the control signal UST connected at an input 18. The clock oscillator G is preferably a voltage controlled oscillator. The output of the clock oscillator G is connected to a counter circuit Z that includes a first counter with an output 28 and a second counter with an output 29. The second counter differs from the first counter in that the output thereof is divided by a factor corresponding to the number of points to be scanned per scan line. The outputs 28 and 29 are connected to respective digital-to-analog converters 30 and 31, the outputs of which correspond to the horizontal and vertical outputs 9 and 10 of the scan generator 8. The scan generator 8, thus, changes the deflection voltages Ux and Uy in line-by-line fashion and may be reset by resetting the first and second counters of the counter circuit Z. Alternately, the first counter output can be divided by number of points in a scan line.

It is within the spirit of the present invention to utilize the control signal UST to increase the scan rate and/or increase the bandwidth of the evaluation circuit so that regions lying outside a predetermined region as defined by the comparison voltages, are more precisely evaluated than a less interesting region within the voltage interval. Alternately, the control signal UST can increase the intensity of the primary beam of the scanning microscope outside the region.

Although disclosed in conjunction with a scanning electron microscope, other scanning microscopes such as a laser microscope or an ultrasound scanning microscope can be used instead of an electron microscope.

As is apparent from the foregoing specification, the invention is susceptible to be embodied with various alterations and modifications which may differ particularly from those that I have described in the preceeding specification and description. It should be understood that I wish to embody within the scope of the patent granted hereon all such modifications as reasonably and properly come within the scope of my contribution to the art.

I claim as my invention:

1. A method for emphasizing a region on a specimen surface during line-by-line scanning by a primary beam of a scanning microscope, comprising the steps of:
    (a) deflecting the primary beam across a specimen surface by a deflection means controlled by at least two deflection signals;
    (b) deriving a secondary electrical signal from the specimen;
    (c) evaluating the secondary electrical signal by an evaluation circuit for use by at least one of a recording means and a display means controlled by the deflection signals;
    (d) generating a control signal from at least one of the deflection signals, the control signal indicating whether a point being scanned by the primary beam lies within a predetermined region of the specimen surface;
    (e) varying at least one scan parameter in response to the control signal, said scan parameter being varied from a first value outside the predetermined region to a second value inside the predetermined region, wherein said at least one scan parameter is the scan rate.

2. A method for emphasizing a region on a specimen surface during line-by-line scanning by a primary beam of a scanning microscope, comprising the steps of:
    (a) deflecting the primary beam across a specimen surface by a deflection means controlled by at least two deflection signals;
    (b) deriving a secondary electrical signal from the specimen;
    (c) evaluating the secondary electrical signal by an evaluation circuit for use by at least one of a recording means and a display means controlled by the deflection signals;
    (d) generating a control signal from at least one of the deflection signals, the control signal indicating whether a point being scanned by the primary beam lies within a predetermined region of the specimen surface;
    (e) varying at least one scan parameter in response to the control signal, said scan parameter being varied from a first value outside the predetermined region to a second value inside the predetermined region, wherein said at least one scan parameter is a bandwidth of the evaluation circuit and wherein the evaluation circuit evaluates the secondary signal by a predetermined bandwidth.

3. A method for emphasizing a region on a specimen surface during line-by-line scanning by a primary beam of a scanning microscope, comprising the steps of:
    (a) deflecting the primary beam across a specimen surface by a deflection means controlled by at least two deflection signals;
    (b) deriving a secondary electrical signal from the specimen;
    (c) evaluating the secondary electrical signal by an evaluation circuit for use by at least one of a recording means and a display means controlled by the deflection signals;
    (d) generating a control signal from at least one of the deflection signals, the control signal indicating whether a point being scanned by the primary beam lies within a predetermined region of the specimen surface;
    (e) varying at least one scan parameter in response to the control signal, said scan parameter being varied from a first value outside the predetermined region to a second value inside the predetermined region, wherein said at least one scan parameter is the intensity of the primary beam.

4. A method as claimed in claim 1, wherein step d includes the step of:
    comparing the at least one deflection signal to a predetermined pair of comparison signals.

5. A method as claimed in claim 4, wherein first and second deflection signals are compared to respective first and second pairs of comparison signals to form respective first and second region indicating signals and the first and second region indicating signals are combined to form the control signal.

6. The method as claimed in claim 1, wherein step d includes the steps of:
    squaring a first deflection signal;
    amplifying the squared first deflection signal;
    squaring a second deflection signal;
    amplifying the squared second deflection signal; and
    adding the first amplified deflection signal to the second amplified deflection signal to produce the control signal.

7. The method as claimed in claim 1, wherein step d includes the steps of:
    amplifying a first deflection signal;
    amplifying a second deflection signal;
    adding the first amplified deflection signal to the second amplified deflection signal; and
    squaring the added deflection signals to produce the control signal.

8. A method as claimed in claim 1, wherein at least one of a recording means and a display means includes a picture tube.

9. A method as claimed in claim 1, wherein step e includes:
    generating a topographic signal from the secondary electrical signal;
    switching between the topographic signal and evaluation circuit signal at an input of the at least one of the recording means and the display means.

10. A method for emphasizing a region on a specimen surface during line-by-line scanning by a primary beam of a scanning microscope, comprising the steps of:

(a) generating first and second deflection voltages;

(b) influencing the primary beam by the first and second deflection voltages to scan the primary beam across a specimen surface;

(c) deriving a secondary electrical signal from the specimen;

(d) evaluating the secondary electrical signal for transmittal to a recording means controlled by the first and second deflection voltages;

(e) generating a control signal dependent upon both the first and second deflection voltages in accordance with a predetermined function, the control signal indicating whether a point being scanned by the primary beam lies within a predetermined region of the specimen surface; and (f) varying a scan parameter in response to changes in the control signal, said scan parameter being varied from a first value outside the predetermined region to a second value inside the predetermined region, wherein said scan parameter is a scan rate.

11. A method for emphasizing a region on a specimen surface during line-by-line scanning by a primary beam of a scanning microscope, comprising the steps of:

(a) generating first and second deflection voltages;

(b) influencing the primary beam by the first and second deflection voltages to scan the primary beam across a specimen surface;

(c) deriving a secondary electrical signal from the specimen;

(d) evaluating the secondary electrical signal for transmittal to a recording means controlled by the first and second deflection voltages;

(e) generating a control signal dependent upon both the first and second deflection voltages in accordance with a predetermined function, the control signal indicating whether a point being scanned by the primary beam lies within a predetermined region of the specimen surface; and (f) varying a scan parameter in response to changes in the control signal, said scan parameter being varied from a first value outside the predetermined region to a second value inside the predetermined region, wherein said scan parameter is a bandwidth of an evaluation circuit and wherein the evaluation circuit evaluates the electrical signal by a predetermined bandwidth.

12. A method for emphasizing a region on a specimen surface during line-by-line scanning by a primary beam of a scanning microscope, comprising the steps of:

(a) generating first and second deflection voltages;

(b) influencing the primary beam by the first and second deflection voltages to scan the primary beam across a specimen surface;

(c) deriving a secondary electrical signal from the specimen;

(d) evaluating the secondary electrical signal for transmittal to a recording means controlled by the first and second deflection voltages;

(e) generating a control signal dependent upon both the first and second deflection voltages in accordance with a predetermined function, the control signal indicating whether a point being scanned by the primary beam lies within a predetermined region of the specimen surface; and (f) varying a scan parameter in response to changes in the control signal, said scan parameter being varied from a first value outside the predetermined region to a second value inside the predetermined region, wherein said scan parameter is the intensity of the primary beam.

13. A device for emphasizing a region on a specimen surface during line by line scanning by a scanning microscope, comprising:

a scan generator connected to generate first and second deflection signals;

deflection means for influencing the primary beam of the scanning microscope, said first and second deflection signals being supplied to said deflection means to scan a specimen;

a detector mounted to receive said secondary particles and generate a secondary electrical signal from said secondary particles;

an evaluation circuit connected to receive said secondary electrical signal;

means for generating a control signal connected to receive at least one of said first and second deflection signals, said control signal indicating whether a point being scanned lies in a predetermined region of a specimen, said control signal being supplied to at least one input of said scan generator to switch said scan generator from a first scan rate to a second scan rate when a point being scanned is within said predetermined region.

14. A device as claimed in claim 13, wherein said control signal generating means includes:

a discriminator unit having at least one comparator connected to receive comparison signals, said comparison signals defining a signal range, said discriminator generating a control signal when said at least one deflection signal is within said signal range.

15. A device as claimed in claim 16 wherein said discriminator unit includes:

first and second comparators connected to receive respective ones of said first and second deflection signals, said first comparator having a first pair of comparison signals defining a first signal range, said second comparator having a second pair of comparison signals defining a second signal range, said first and second comparators generating outputs when said deflections signals are within respective ones of said first and second signal ranges; and a logic gate connected to receive outputs of said first and second comparators and generate the control signal.

16. A device as claimed in claim 13, wherein said control signal generating means includes a function network connected to derive said control signal from the amplitudes of at least one of said deflection voltages in accordance with a predetermined function.

17. A device as claimed in claim 13, wherein said function network includes:

first and second squaring units connected to receive said first and second deflection voltages;

first and second variable gain amplifier stages connected at respective outputs of said first and second squaring units, and an adding circuit connected to add the output signals of said first and second amplifier stages to produce said control signal.

18. A device as claimed in claim 13, wherein said function network includes:

first and second variable gain amplifier stages connected to receive respective ones of said first and second deflection voltages; an adder circuit connected to add outputs of said first and second variable gain amplifiers; and a squaring circuit connected to square an output of said adding circuit.

19. A device as claimed in claim 13, further comprising:

an intensity modulator mounted for varying the intensity of said primary beam and being controlled with said control signal.

20. A device as claimed in claim 13, wherein said evaluation circuit is a variable bandwidth circuit and said control signal is connected to control the bandwidth of said evaluation circuit.

21. A device as claimed in claim 13, wherein said evaluation circuit is a first evaluation and has a defined bandwidth and further comprising:

a second evaluation circuit having a bandwidth substantially broader than said first evaluation circuit bandwidth;

a switch-over means actuatable by said control signal and connected to alternately connect outputs of said first and second evaluation circuits to said recording means.

22. A device as claimed in claim 11, further comprising a switch-over means controlled by said control signal and connected to supply a topography signal to said recording means.

23. A method as claimed in claim 1, wherein said secondary electrical signal is derived via a detector from a secondary particle current generated by said primary particle beam.

24. A method as claimed in claim 2, wherein a bandwidth of said evaluation circuit is also varied in step (e).

25. A method for emphasizing a region on a specimen surface during line-by-line scanning by a primary beam of a scanning microscope, comprising the steps of:

(a) deflecting the primary beam across a specimen surface by a deflection means controlled by at least two deflection signals;

(b) deriving a secondary electrical signal from the specimen;

(c) evaluating the secondary electrical signal by an evaluation circuit for use by at least one of a recording means and a display means controlled by the deflection signals, the control signal indicating whether a point being scanned by the primary beam lies within a predetermined region of the specimen surface; and (d) using the control signal to vary a bandwith of the evaluation circuit, the bandwidth being varied from a first value outside the predetermined region to a second value inside the predetermined region.

26. A method as claimed in claim 25, wherein a scan rate of the primary beam is also varied in step (e).

27. A method as claimed in claim 25, wherein an intensity of the primary beam is also varied in step (e).

28. A method as claimed in claim 12, wherein a bandwidth of the evaluation circuit is also varied in step (f).

29. A method for emphasizing a region on a specimen surface during line-by-line scanning by a primary beam of a scanning microscope, comprising the steps of:

(a) generating first and second deflection voltages;

(b) influencing the primary beam by the first and second deflection voltages to scan the primary beam across a specimen surface;

(c) deriving a secondary electrical signal from the specimen;

(d) evaluating the secondary electrical signal for transmittal to a recording means controlled by the first and second deflection voltages;

(e) generating a control signal dependant upon both the first and second deflection voltages in accordance with a predetermined function, the control signal indicating whether a point being scanned by the primary beam lies within a predetermined region of the specimen surface; and (f) varying a bandwidth of an evaluation circuit in response to changes in the control signal, said bandwidth being varied from a first value outside the predetermined region to a second value inside the predetermined region.

30. A method as claimed in claim 29, wherein a scan rate of the primary beam is also varied in step (f).

31. A method as claimed in claim 29, wherein an intensity of the primary beam is also varied in step (f).

32. A method as claimed in claim 3, wherein a bandwidth of said evaluation circuit is also varied in step (e).

* * * * *